(12) United States Patent
Fujii

(10) Patent No.: US 7,542,006 B2
(45) Date of Patent: Jun. 2, 2009

(54) WIRING BOARD AND SEMICONDUCTOR APPARATUS

(75) Inventor: Tomoharu Fujii, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 59 days.

(21) Appl. No.: 11/754,767

(22) Filed: May 29, 2007

(65) Prior Publication Data

US 2007/0279879 A1    Dec. 6, 2007

(30) Foreign Application Priority Data

May 30, 2006  (JP) .............................. 2006-150414

(51) Int. Cl.
*H01Q 23/00* (2006.01)
(52) U.S. Cl. ....................................... 343/853; 333/247
(58) Field of Classification Search ................. 333/247; 343/853, 700 MS
See application file for complete search history.

(56) References Cited

U.S. PATENT DOCUMENTS

| 4,987,425 | A | * | 1/1991 | Zahn et al. | .................. 343/853 |
| 5,023,624 | A | * | 6/1991 | Heckaman et al. | .......... 343/860 |
| 5,608,263 | A | * | 3/1997 | Drayton et al. | ............. 257/728 |
| 6,181,278 | B1 | * | 1/2001 | Kakimoto et al. | ..... 343/700 MS |
| 2004/0095214 | A1 | * | 5/2004 | Marlow et al. | ............... 333/246 |
| 2005/0088260 | A1 | * | 4/2005 | Ajioka et al. | ................ 333/247 |

FOREIGN PATENT DOCUMENTS

JP          2002-33419          1/2002

* cited by examiner

*Primary Examiner*—Benny T. Lee
(74) *Attorney, Agent, or Firm*—Rankin, Hill & Clark LLP

(57) ABSTRACT

An inverse F type antenna is provided and includes first wiring portions provided on an upper face of a board, second wiring portions provided on a lower face of the board, connecting portions electrically connecting the first wiring portions and the second wiring portions, in which the connecting portions are provided at a side face of the board.

6 Claims, 22 Drawing Sheets

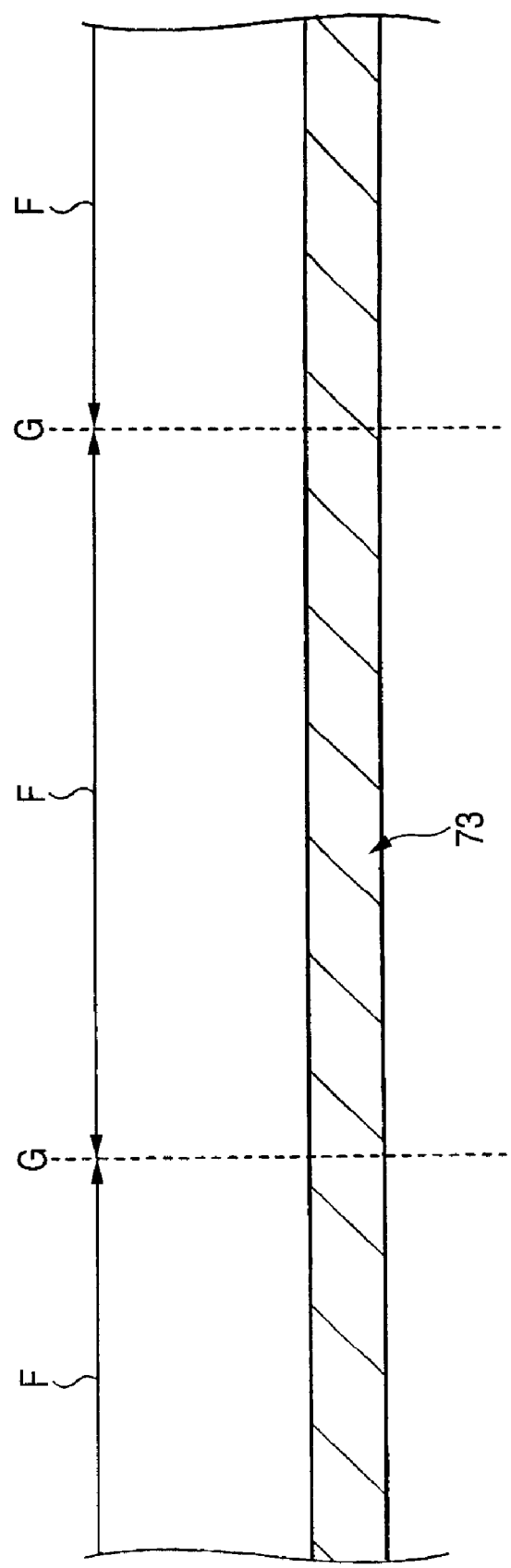

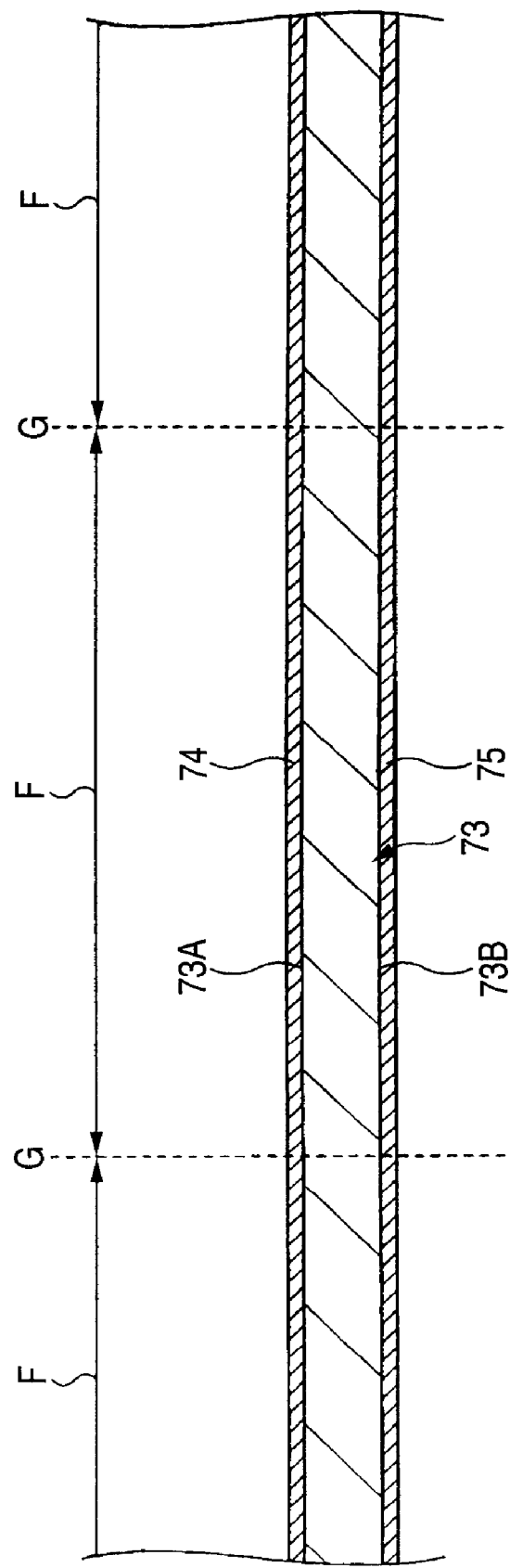

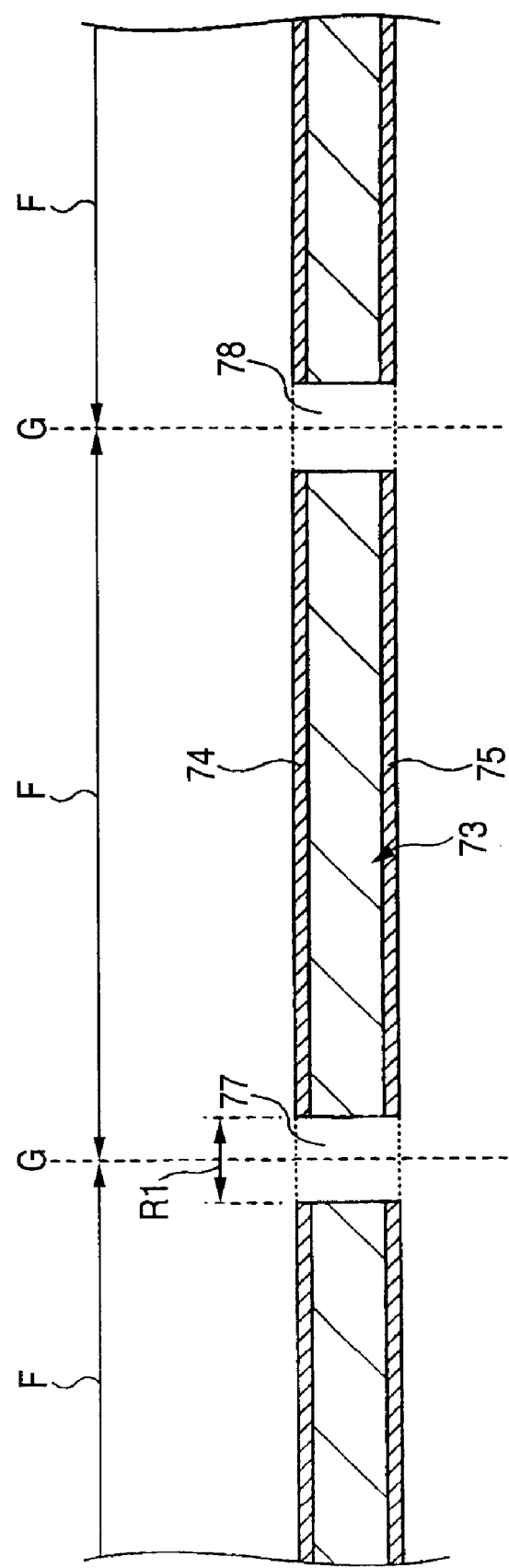

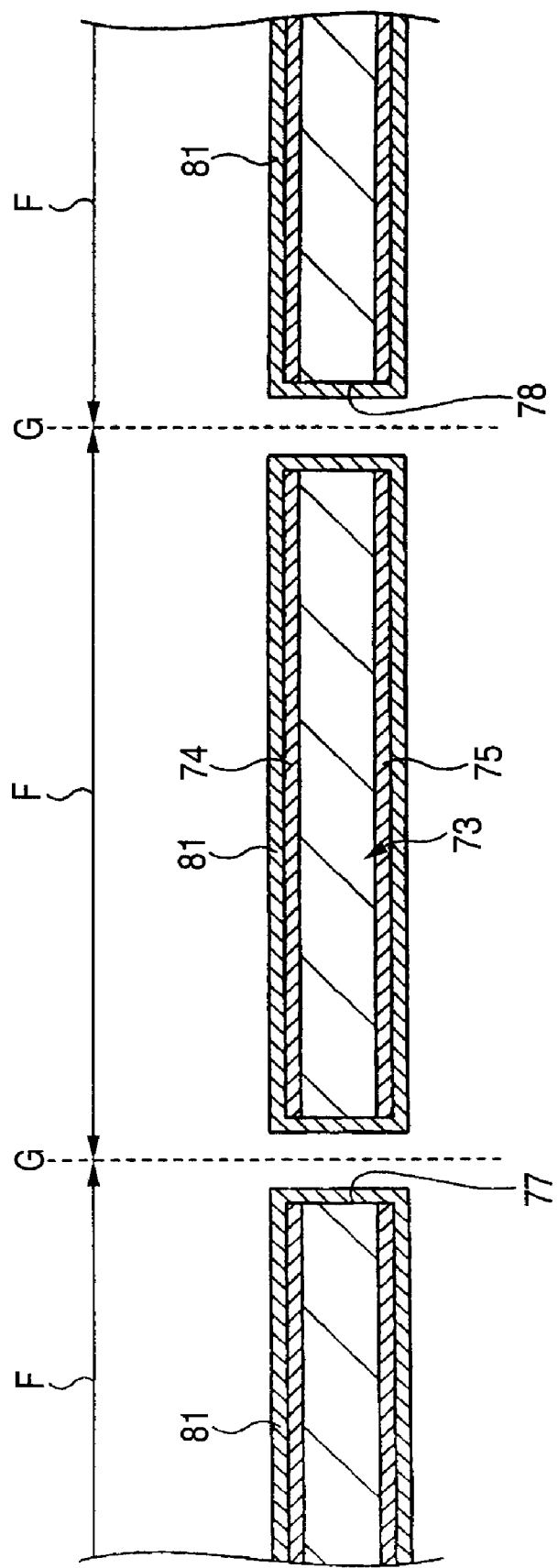

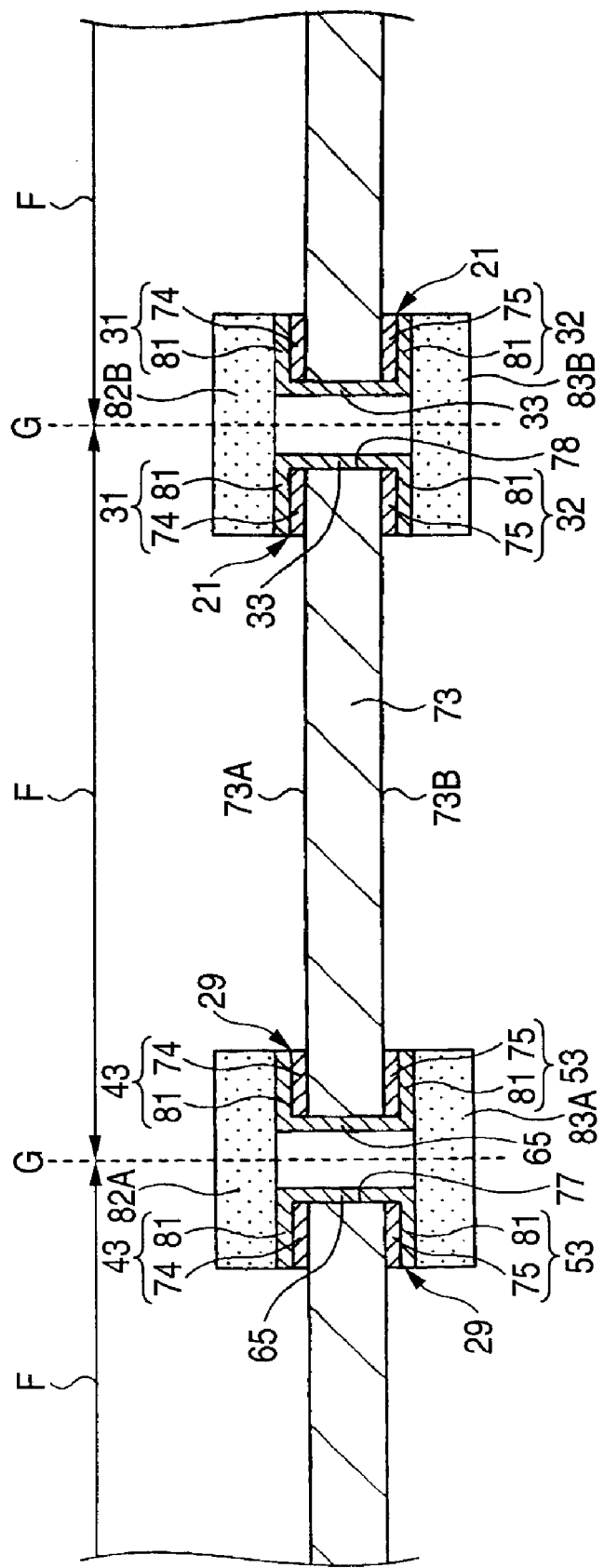

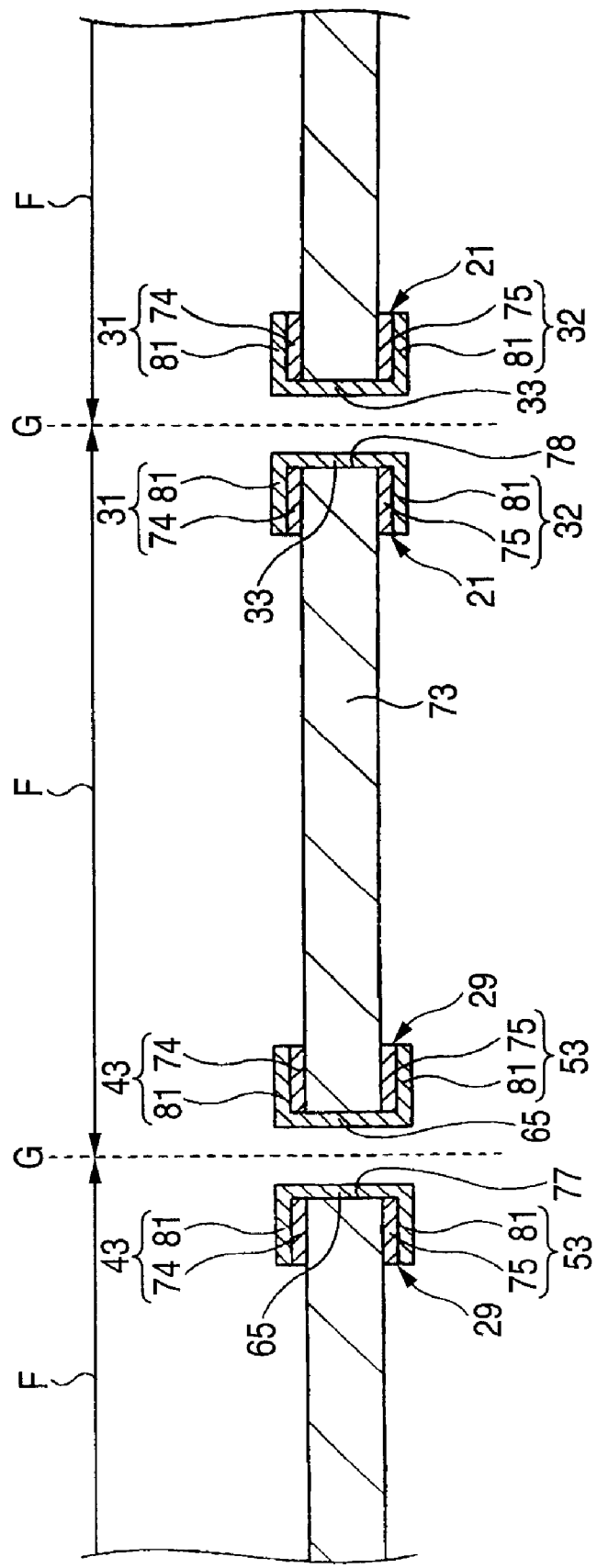

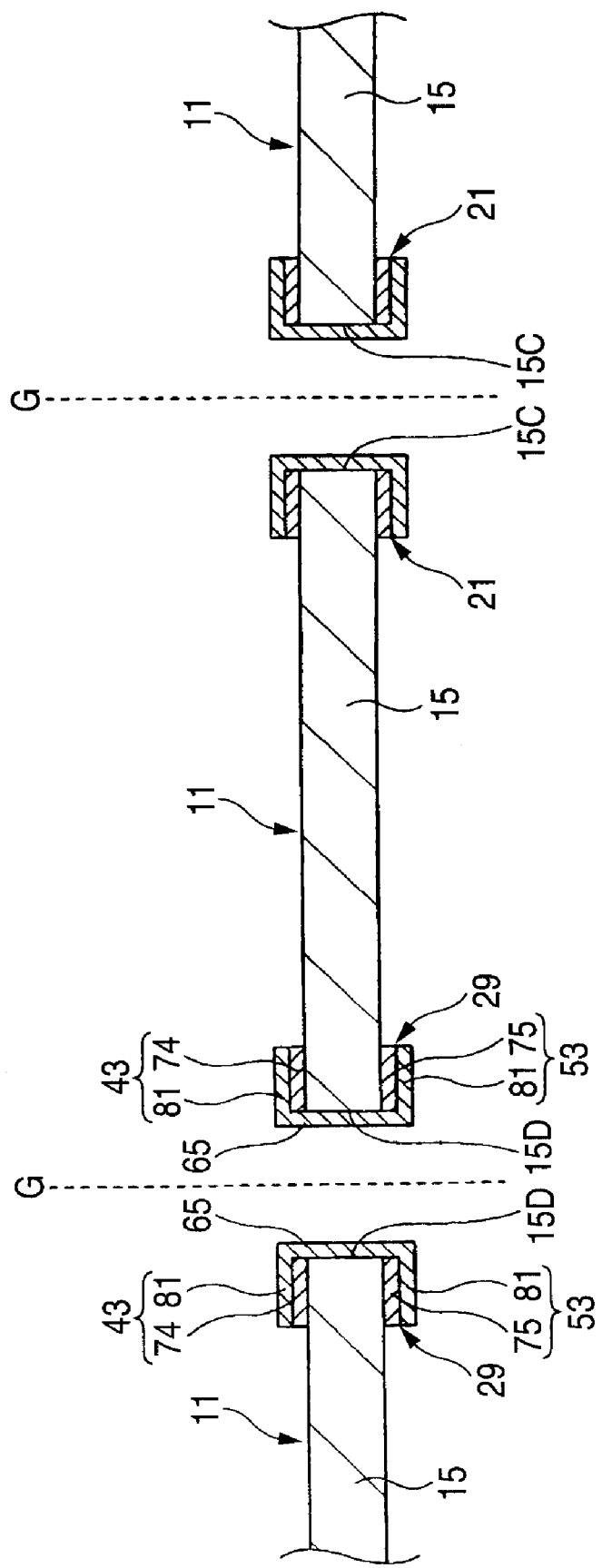

WIRING BOARD AND SEMICONDUCTOR APPARATUS

BACKGROUND OF THE INVENTION

The present invention relates to a wiring board and a semiconductor apparatus, and more particularly to a wiring board and a semiconductor apparatus that includes an antenna pattern electrically connected to an electronic part.

FIG. 1 is a plan view of a conventional semiconductor apparatus that includes a conventional antenna pattern. FIG. 2 is a plan view of the conventional wiring board 201. In FIG. 2, notation I designates a region mounted with the control circuit part 202 in FIG. 1 (hereinafter, referred to as 'control circuit mounting region I'), notation J designates a region mounted with the RF circuit part 203 in FIG. 1 (hereinafter, referred to as 'RF circuit mounting region J'), respectively. FIG. 3 is a plan view of the conventional semiconductor apparatus connected to a mounting board.

In reference to FIGS. 1, 2 and 3, the conventional semiconductor apparatus 200 includes a wiring board 201, a control circuit part 202 and an RF circuit part 203 constituting electronic parts. The control circuit part 202 and the RF circuit part 203 are mounted to the wiring board 201.

In

Still referring to FIGS. 1, 2 and 3, the wiring board 201 includes a board 205, connecting pads 206, 207, 208 and 209, end face electrodes 211, 212, wirings 214, 215 and 216, and an antenna pattern 218. The connecting pads 206, 207 are provided on an upper face 205A of the board 205 in correspondence with the control circuit mounting region I. The connecting pads 206, 207 are pads electrically connected to the control circuit part 202.

The connecting pads 208, 209 are provided on the upper face 205A of the board 205 in correspondence with the RF circuit mounting region J. The connecting pads 208, 209 are pads electrically connected to the RF circuit part 203.

The end face electrodes 211 are provided at vicinities of side faces 205-1, 205-2 and 205-3 of the board 205 remote from the antenna pattern 218. The end face electrodes 212 are provided at the vicinity of the side face 205-3 of the board 205 remote from the antenna pattern 218. The end face electrodes 211, 212 are external portion connecting terminals for electrically connecting the semiconductor apparatus 200 to a mounting board of a mother board or the like (refer to FIG. 3).

The wirings 214, 215 and 216 are provided on the upper face 205A of the board 205. One end portion of the wiring 214 is connected to the connecting pad 206, the other end portion thereof is connected to the end face electrodes 211. One end portion of the wiring 215 is connected to the connecting pad 208, the other end portion thereof is connected to the end face electrodes 212. One end portion of the wiring 216 is connected to the connecting pad 207, the other end portion thereof is connected to the connecting pad 209.

The antenna pattern 218 is an inverse F type antenna. The antenna pattern 218 is provided on the upper face 205A of the board 205 remote from a side face 205-4 of the board 205. That is, a space is provided between the antenna pattern 218 and the side face 205-4 of the board 205. The antenna pattern 218 is electrically connected to the RF circuit part 203.

Referring to FIG. 3, when the semiconductor apparatus 200 is mounted to a mounting board 220, a pad 221, which is provided on the mounting board 220, and the end face electrode 211 are electrically connected with solder 224. In addition, a pad 222 provided on the mounting board 220 and the end face electrode 212 are electrically connected with solder 225. Further, the three side faces 205-1, 205-2 and 205-3 (FIG. 2 of the semiconductor apparatus 200 are fixed to the mounting board 220 with solders 224, 225 (refer to, for example, Patent Reference 1).

[Patent Reference 1]
  JP-A-2002-33419

However, according to the conventional wiring board 201, an area occupied by the antenna pattern 218 on the upper face 205A (FIG. 2) of the board 205 is large. Therefore, one problem is that it is difficult to reduce a size in a direction of a face of the board 205 making it difficult to decrease the size of the wiring board 201.

Further, since it is difficult to decrease the size of the wiring board 201 the size of the semiconductor apparatus 200 including the wiring board 201 cannot be decreased.

Hence, the present invention is carried out in view of the above-described problem and it is an object thereof to provide a wiring board and a semiconductor apparatus capable of being decreased in size.

SUMMARY OF THE INVENTION

According to a first aspect of the invention, a wiring board is provided that includes a board arranged with an electronic part and an antenna pattern formed at the board and electrically connected to the electronic part, wherein a portion of the antenna pattern is provided at a side face of the board.

According to the invention, by providing a portion of the antenna pattern at the side face of the board, an area occupied by the antenna pattern on the board is reduced, and therefore, the size of the wiring board can be decreased by reducing the size in a direction of a face of the board.

According to a second aspect of the invention, a semiconductor apparatus is provided and includes an electronic part, a board arranged with the electronic part and an antenna pattern formed at the board and electrically connected to the electronic part, wherein a portion of the antenna pattern is provided at a side face of the board.

According to the invention, by providing a portion of the antenna pattern at the side face of the board, the area occupied by the antenna pattern on the board is reduced, and therefore, the semiconductor apparatus can be decreased by reducing the size in the direction of the face of the wiring board.

According to the invention, the size of the wiring board and the semiconductor apparatus can be decreased.

BRIEF DESCRIPTION OF THE DRAWINGS

FIG. 10A is a view showing a fabricating step of the wiring board according to the first embodiment of the invention.

FIG. 10B is a view showing a fabricating step of the wiring board according to the first embodiment of the invention.

FIG. 10C is a view showing a fabricating step of the wiring board according to the first embodiment of the invention.

FIG. 10D is a view showing a fabricating step of the wiring board according to the first embodiment of the invention.

FIG. 10G is a view showing a fabricating step of the wiring board according to the first embodiment of the invention.

FIG. 10H is a view showing a fabricating step of the wiring board according to the first embodiment of the invention.

FIG. 10I is a view showing a fabricating step of the wiring board according to the first embodiment of the invention.

DETAILED DESCRIPTION OF THE PREFERRED EMBODIMENTS

Next, embodiments of the invention will be explained in reference to the drawings where like features in the different drawing figures are designated by the same numbers.

First Embodiment

Figure 4:
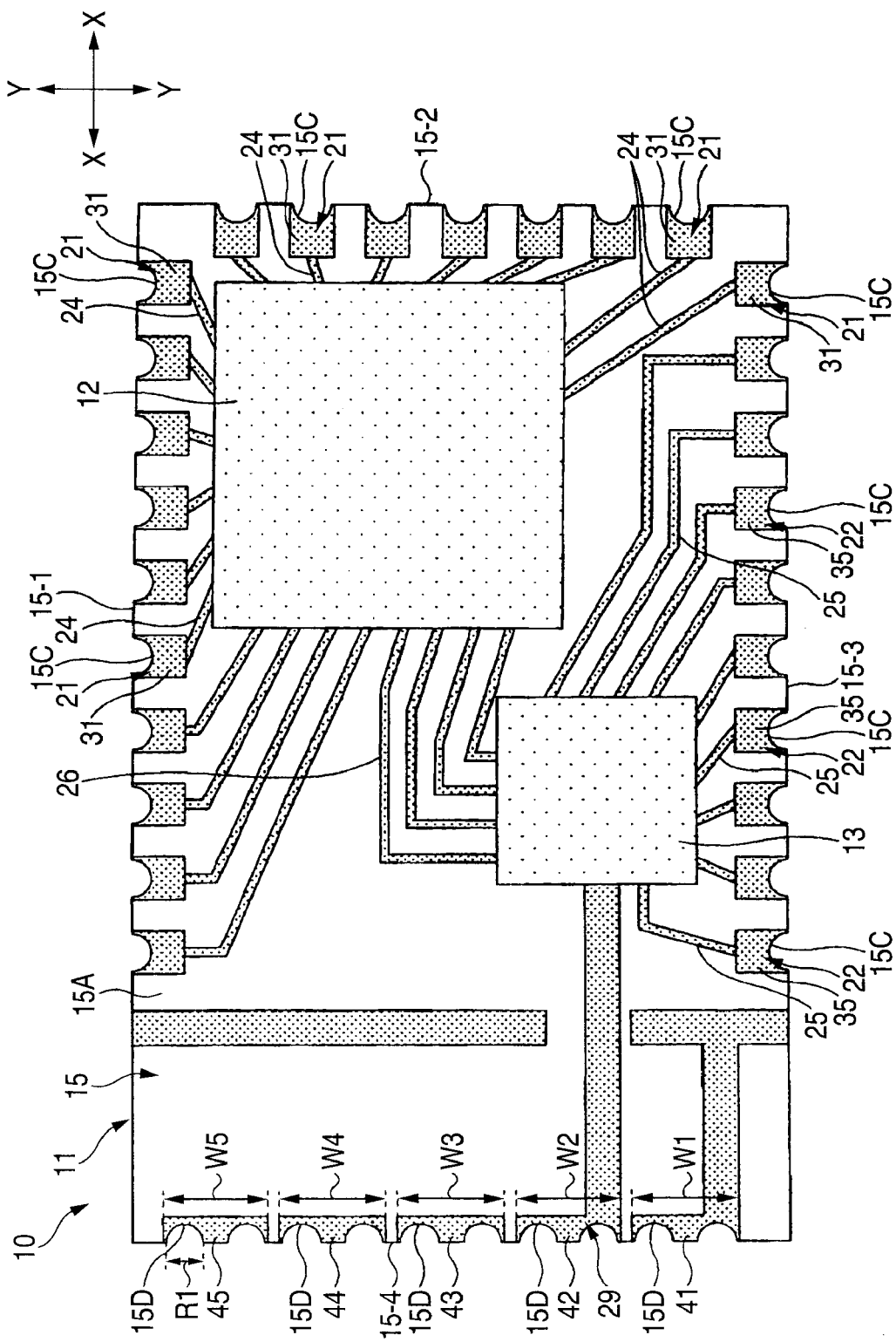
FIG. 4 is a plan view of a semiconductor apparatus according to a first embodiment of the invention.

FIG. 4 is a plan view of a semiconductor apparatus according to a first embodiment of the invention. In FIG. 4, an X-X direction indicates a direction parallel with side faces 15-1, 15-3 of a board 15, and a Y-Y direction designates a direction parallel with side faces 15-2, 15-4 of the board 15, respectively.

A semiconductor apparatus 10 according to the first embodiment of the invention will be explained in reference to FIG. 4. Further, according to the embodiment, an explanation will be given as follows by taking an example of a case of providing an inverse F type antenna 29 at a wiring board 11 as an antenna pattern.

In reference to FIG. 4, the semiconductor apparatus 10 according to the first embodiment includes the wiring board 11, a control circuit part 12 and an RF circuit part 13 constituting electronic parts.

Figure 5:
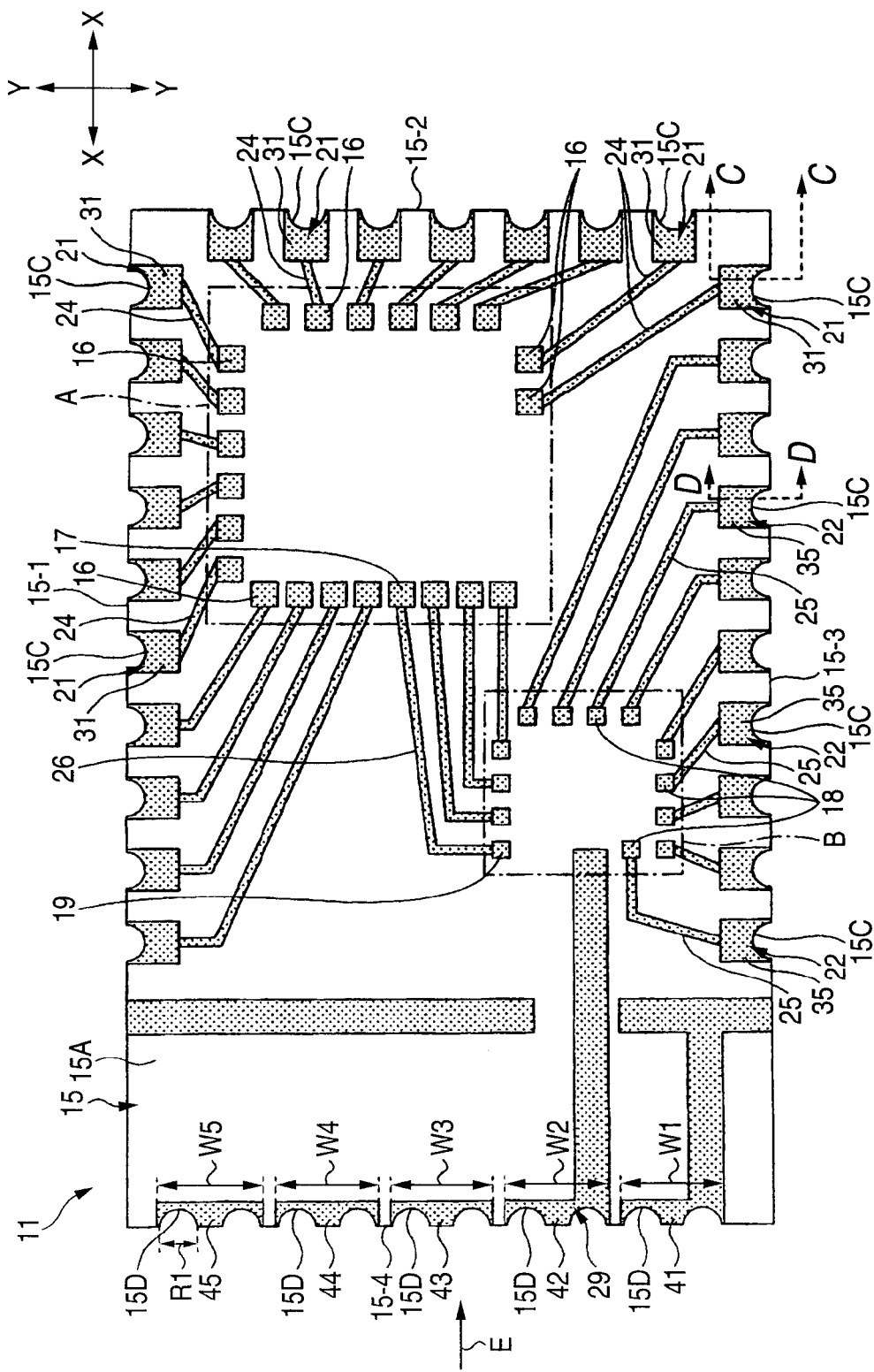
FIG. 5 is a plan view of a wiring board according to the first embodiment of the invention.
Figure 6:
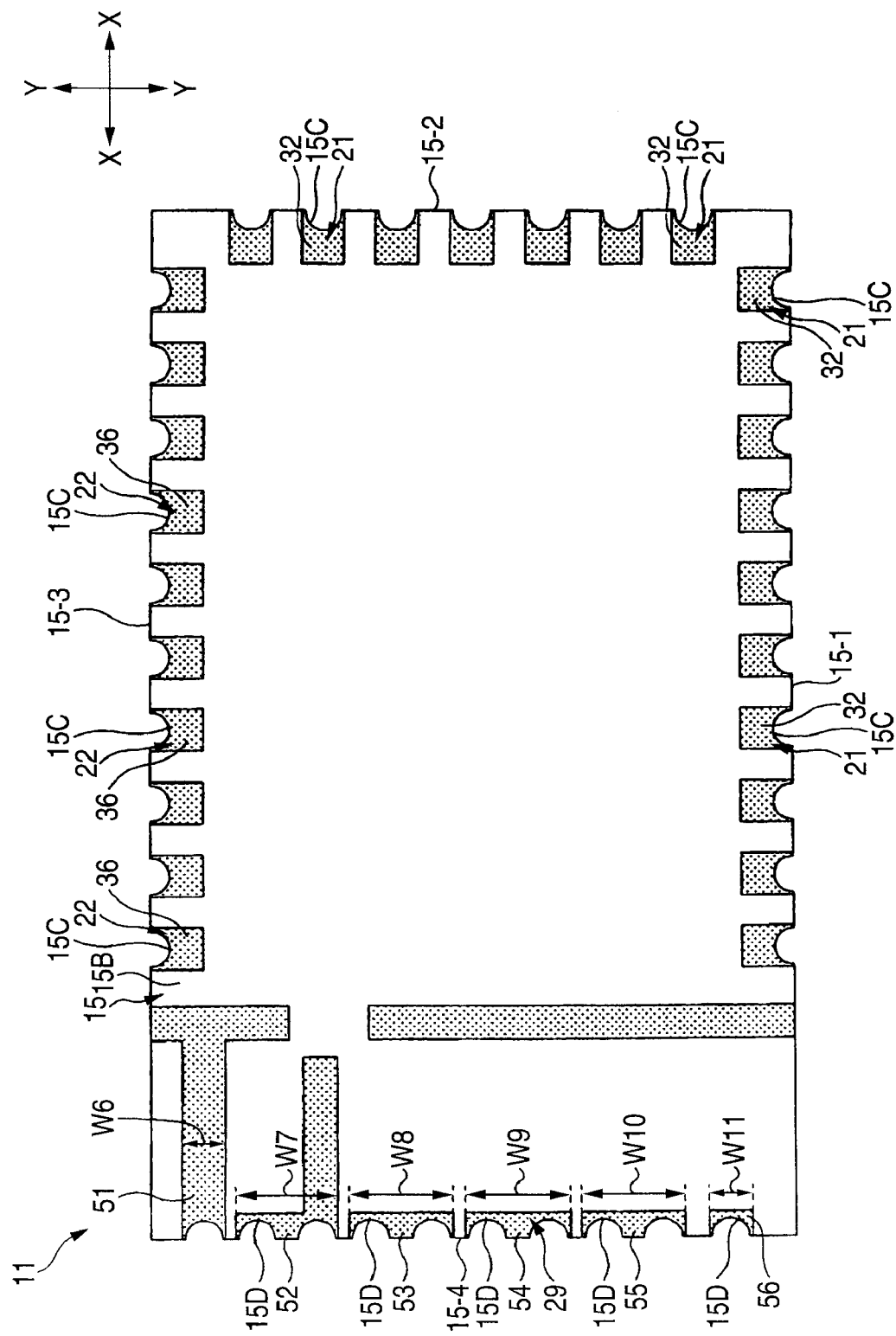
FIG. 6 is a view showing a lower face side of the wiring board shown in FIG. 5 in a plan view.

FIG. 5 is a plan view of a wiring board according to the first embodiment of the invention and FIG. 6 is a view showing a lower face side of the wiring board shown in FIG. 5. In FIGS. 5 and 6, constituent portions the same as those of the semiconductor apparatus 10 shown in FIG. 4 are attached with the same notations. Further, in FIG. 5, notation A designates a region mounted with the control circuit part 12 (hereinafter, referred to as 'control circuit mounting region A'), notation B designates a region mounted with the RF circuit part 13 (hereinafter, referred to as 'RF circuit mounting region B' respectively.

In reference to FIGS. 4, 5 and 6, the wiring board 11 includes the board 15, connecting pads 16, 17, 18, and 19 (FIG. 5), end face electrodes 21, 22, wirings 24, 25, and 26 (FIG. 5), and the inverse F type antenna 29.

The board 15 is constituted by a plate-like shape and includes a plurality of notch portions 15C, 15D. The notch portions 15C are formed at the side faces 15-1, 15-2, and 15-3. The notch portion 15C is constituted by a semi-cylindrical shape and is formed to range from an upper face 15A (first main face), as shown in FIG. 5, to a lower face 15B (second main face), as shown in FIG. 6, of the board 15.

The notch portion 15D is formed at the side face 15-4 of the board 15. The notch portion 15D is constituted by a semi-cylindrical shape and is formed to range from the upper face 15A to the lower face 15B of the board 15. A diameter R1 (FIG. 5) of the notch portion 15D can be constituted by, for example, 0.6 mm. The board 15 is a board for forming the connecting pads 16, 17, 18, and 19, the end face electrodes 21, 22, the wirings 24, 25, and 26, and the inverse F type antenna 29.

The connecting pads 16, 17 are provided on the upper face 15A of the board 15 in correspondence with the control circuit mounting region A, as shown in FIG. 5. The connecting pads 16, 17 are pads electrically connected to the control circuit part 12. The connecting pad 16 is electrically connected to the end face electrode 21 by way of the wiring 24. The connecting pad 17 is electrically connected to the connecting pad 19 by way of the wiring 26.

The connecting pads 18, 19 are provided on the upper face 15A of the board 15 in correspondence with the RF circuit mounting region B. The connecting pads 18, 19 are pads electrically connected to the RF circuit part 13. The connecting pad 18 is electrically connected to the end face electrode 22 by way of the wiring 25 (FIG. 5). The connecting pad 19 is electrically connected to the connecting pad 17 by way of the wiring 26 (FIG. 5).

Figure 7:
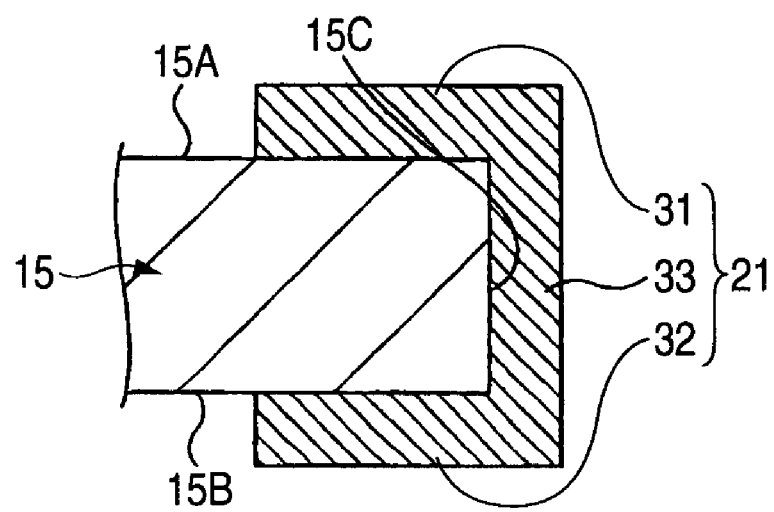
FIG. 7 is a sectional view in a C-C line direction of the wiring board shown in FIG. 5.

FIG. 7 is a sectional view in a C-C line direction of the wiring board shown in FIG. 5.

In reference to FIGS. 4 through 7, the end face electrode 21 includes a first pad portion 31, a second pad portion 32, and a connecting portion 33. The first pad portion 31 is provided on the upper face 15A of the board 15 disposed at vicinities of the notch portions 15C formed at the side faces 15-1, 15-2, and 15-3 of the board 15. The first pad portion 31 is constituted integrally with the connecting portion 33. The first pad portion 31 is electrically connected to the connecting pad 16 by way of the wiring 24 (refer to FIG. 5).

The second pad portion 32 is provided on the lower face 15B of the board 15 disposed at a vicinity of the notch portion 15C. The second pad portion 32 is constituted integrally with the connecting portion 33. The connecting portions 33 are provided at the notch portions 15C formed at the side faces 15-1, 15-2, and 15-3 of the board 15. The connecting portion 33 is for electrically connecting the first pad portion 31 and the second pad portion 32.

Figure 8:
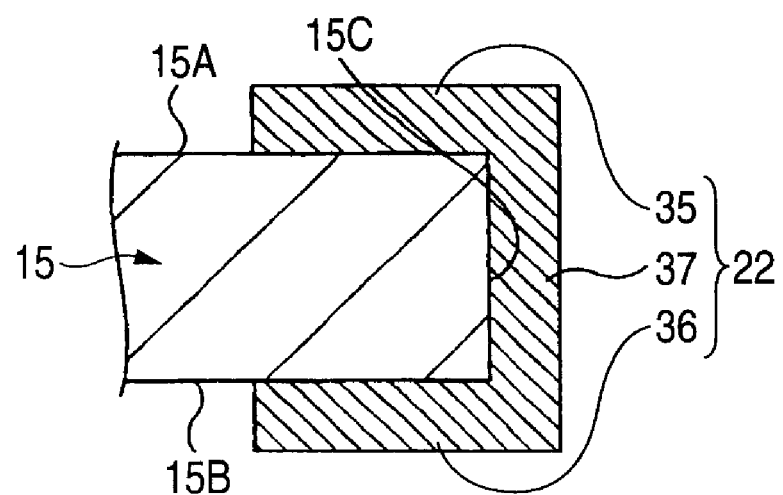
FIG. 8 is a sectional view in a D-D line direction of the wiring board shown in FIG. 5.

FIG. 8 is a sectional view in a D-D line direction of the wiring board shown in FIG. 5.

In reference to FIG. 8, the end face electrode 22 includes a first pad portion 35, a second pad portion 36, and a connecting portion 37. The first pad portion 35 is provided on the upper face 15A of the board 15 disposed at a vicinity of the notch portion 15C formed at the side face 15-3 of the board 15. The first pad portion 35 is constituted integrally with the connecting portion 37. The first pad portion 35 is electrically connected to the connecting pad 18 by way of the wiring 25 (refer to FIG. 5).

The second pad portion 36 is provided on the lower face 15B of the board 15 disposed at a vicinity of the notch portion 15C formed at the side face 15-3 of the board 15. The connecting portion 37 is for electrically connecting the first pad portion 35 and the second pad portion 36. The end face electrodes 21, 22 constituted as described above are external connecting terminals for electrically connecting the semiconductor apparatus 10 to a mounting board of a mother board or the like.

The wirings 24, 25, and 26 are provided on the upper face 15A of the board 15. One end portion of the wiring 24 is connected to the connecting pad 16, and other end portion thereof is connected to the end face electrode 21. One end portion of the wiring 25 is connected to the connecting pad 18 and other end portion thereof is connected to the end face electrode 22. One end portion of the wiring 26 is connected to the connecting pad 17 and other end portion thereof is connected to the connecting pad 19.

Figure 9:
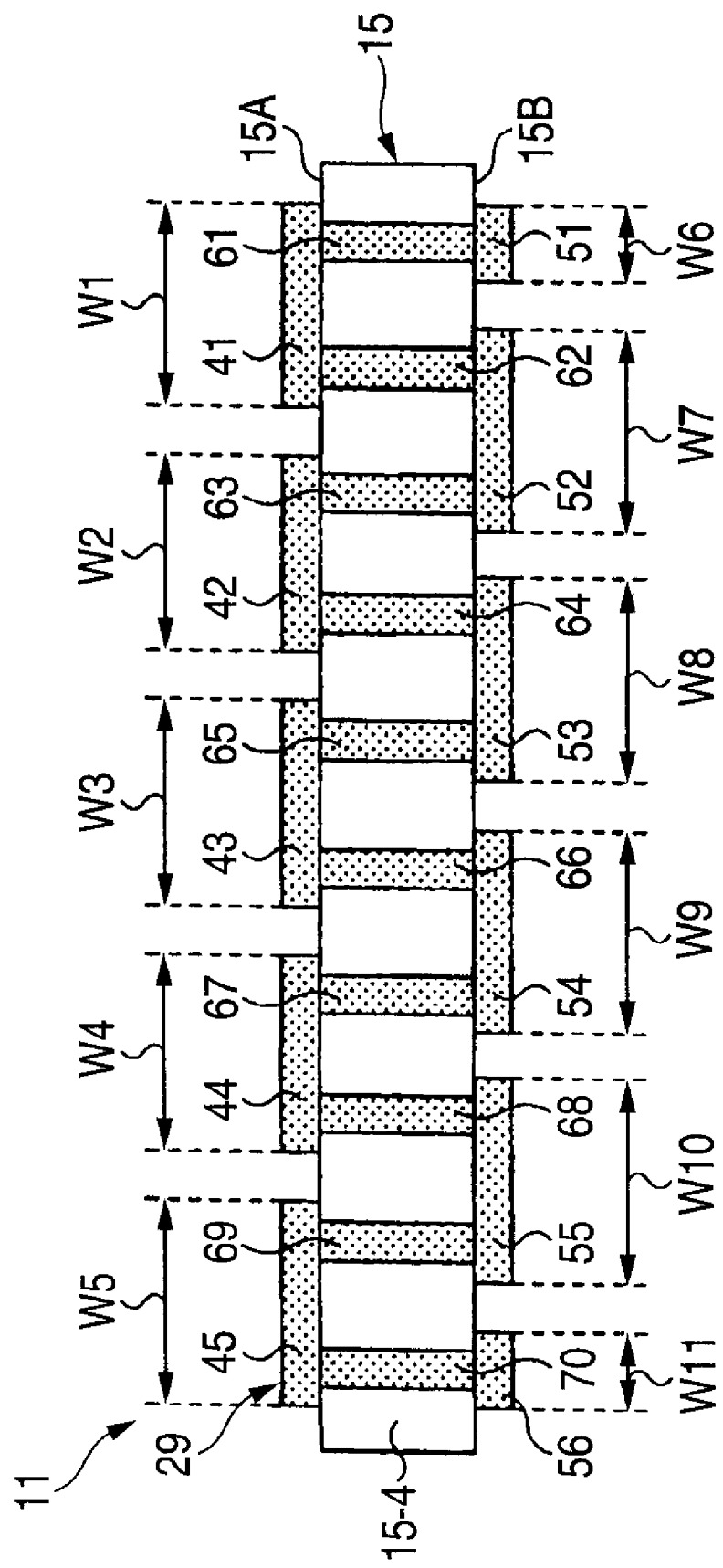
FIG. 9 is a view viewing the wiring board shown in FIG. 5 from an arrow mark E direction.

FIG. 9 is a view showing the wiring board 11 shown FIG. 5 in the direction of the arrow E.

An explanation will be given of the inverse F type antenna 29 constituting the antenna pattern in reference to FIGS. 5, 6 and 9. The inverse F type antenna 29 is electrically connected to a ground layer and a power source layer (both of which are not illustrated) formed at the board 15. The inverse F type antenna 29 includes first wiring portions 41, 42, 43, 44, and 45 (FIGS. 5 and 9), second wiring portions 51, 52, 53, 54, 55, and 56 (FIGS. 6 and 9), and connecting portions 61, 62, 63, 64, 65, 66, 67, 68, 69, and 70 (FIG. 9).

The first wiring portions 41, 42, 43, 44, and 45 are provided at the upper face 15A of the board 15 in correspondence with positions of forming the notch portion 15D. The first wiring portions 41, 42, 43, 44, and 45 are arranged in the Y-Y direction to respectively surround two of the notch portions 15D (FIG. 5). Widths W1, W2, W3, W4, and W5 (FIGS. 5 and 9) of the first wiring portions 41, 42, 43, 44, and 45 can be constituted by values substantially equal to each other. The widths W1, W2, W3, W4, and W5 of the first wiring portions 41, 42, 43, 44, and 45 can be constituted by, for example, 1.6 mm. The first wiring portion 42 is electrically connected to the RF circuit part 13.

The second wiring portions 51, 52, 53, 54, 55, and 56 are provided on the lower face 15B of the board 15 in correspondence with positions of forming the notch portion 15D. The second wiring portions 51, 52, 53, 54, 55, and 56 are arranged in the Y-Y direction (FIG. 6). The second wiring portions 52, 53, 54, and 55 are arranged to respectively surround two of the notch portions 15D, and the second wiring portions 51 and 56 are arranged to respectively surround one of the notch portions 15D as best shown in FIG. 6.

The second wiring portion 51 is electrically connected to the first wiring portion 41 by way of the connecting portion 61, as shown in FIG. 9. A width W6 (FIGS. 5 and 9) of the second wiring portion 51 can be constituted by, for example, 0.8 mm.

Referring now to FIG. 9, the second wiring portion 52 is electrically connected to the first wiring portion 41 by way of the connecting portion 62 and electrically connected to the first wiring portion 42 by way of the connecting portion 63. A width W7, see also FIG. 5, of the second wiring portion 52 can be constituted by, for example, 1.6 mm.

The second wiring portion 53 is electrically connected to the first wiring portion 42 by way of the connecting portion 64 and electrically connected to the first wiring portion 43 by way of the connecting portion 65. A width W8, see also FIG. 5, of the second wiring portion 53 can be constituted by, for example, 1.6 mm.

The second wiring portion 54 is electrically connected to the first wiring portion 43 by way of the connecting portion 66 and electrically connected to the first wiring portion 44 by way of the connecting portion 67. A width W9, see also FIG. 5, of the second wiring portion 54 can be constituted by, for example, 1.6 mm.

The second wiring portion 55 is electrically connected to the first wiring portion 44 by way of the connecting portion 68 and electrically connected to the first wiring portion 45 by way of the connecting portion 69. A width W10, see also FIG. 5, of the second wiring portion 55 can be constituted by, for example, 1.6 mm.

The second wiring portion 56 is electrically connected to the first wiring portion 45 by way of the connecting portion 70. A width W11, see also FIG. 5, of the second wiring portion 56 can be constituted by, for example, 0.8 mm.

The connecting portions 61, 62, 63, 64, 65, 66, 67, 68, 69, and 70 are provided at the notch portions 15D (FIG. 6). The connecting portions 61, 62, 63, 64, 65, 66, 67, 68, 69, and 70 electrically connect the first wiring portions 41, 42, 43, 44, and 45 provided on the upper face 15A of the board 15 and the second wiring portions 51, 52, 53, 54, 55, and 56 provided on the lower face 15B of the board 15.

According to the embodiment, by providing a portion (in this case, the connecting portions 61, 62, 63, 64, 65, 66, 67, 68, 69, and 70) of the inverse F type antenna 29 at the side face 15-4 (FIGS. 6 and 9) of the board 15, an area occupied by the inverse F type antenna 29 at the upper face 15A of the board 15 is reduced, and therefore, the size of the wiring board 11 can be decreased by reducing a size in a direction of a face of the board 15.

Figure 1:
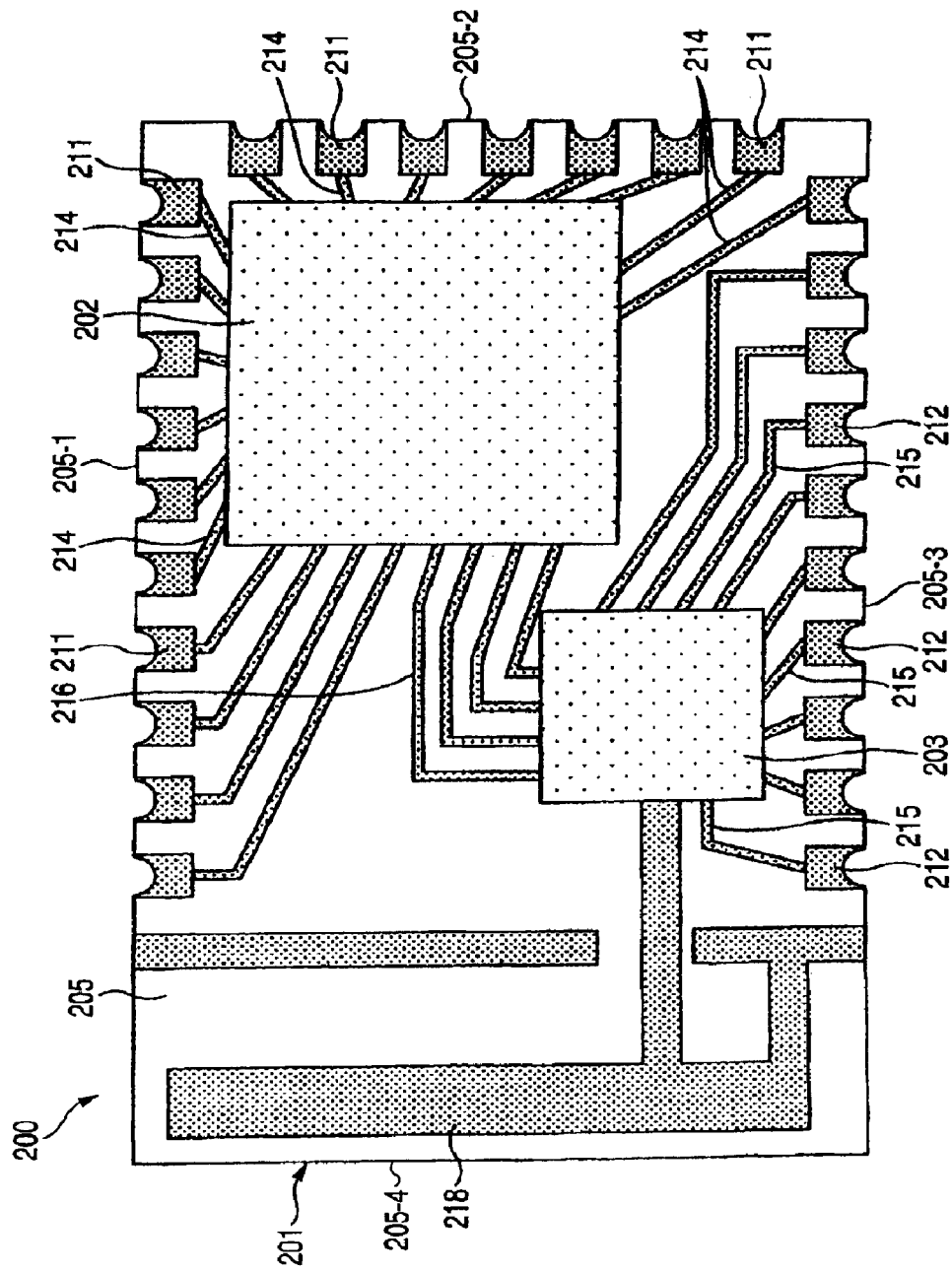
FIG. 1 is a plan view of a semiconductor apparatus including a conventional antenna pattern.
Figure 2:
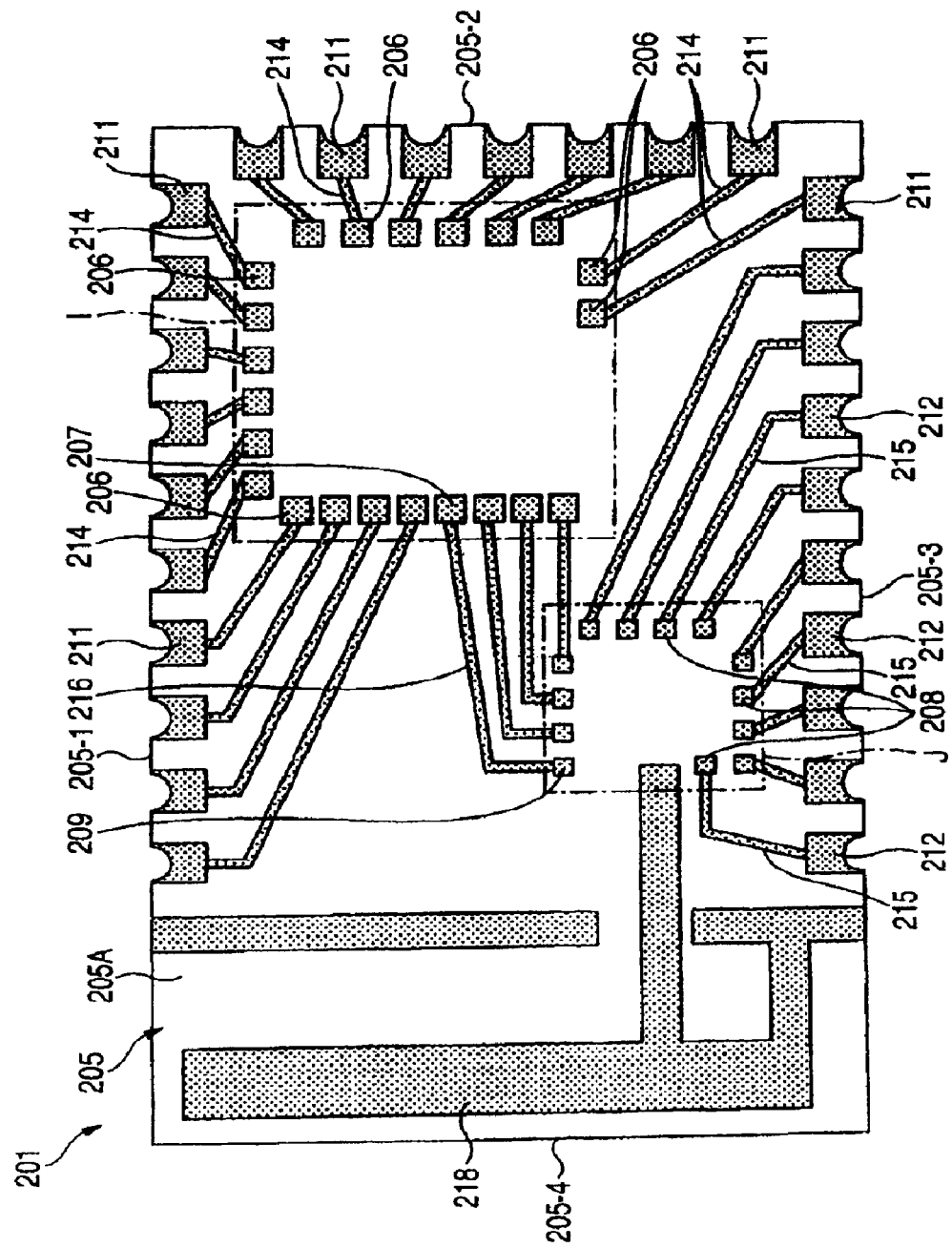
FIG. 2 is a plan view of a conventional wiring board.
Figure 3:
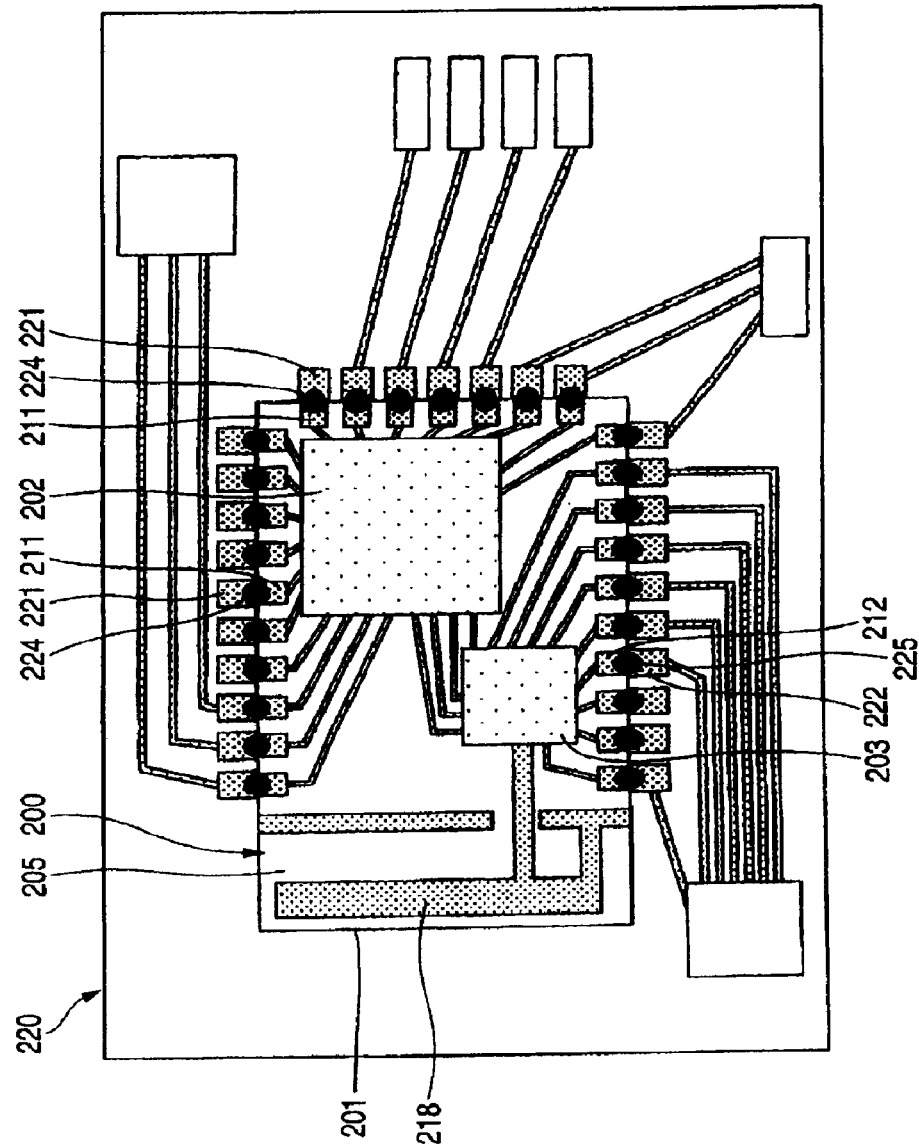
FIG. 3 is a plan view of the conventional semiconductor apparatus connected to a mounting board.

Further, the space between the side face 205-4 of the board 205 and the antenna pattern 218 provided at the conventional semiconductor apparatus 200 (refer to FIG. 1 or 2) is dispensed with, and therefore, the size of the wiring board 11 can be decreased by reducing the size in the direction of the face of the board 15.

Further, since the size of the wiring board 11 can be decreased, the size of the semiconductor apparatus 10 including the wiring board 11 can be decreased.

Further, by constituting the inverse F type antenna 29 by the first wiring portions 41, 42, 43, 44, and 45 provided on the upper face 15A of the board 15, the second wiring portions 51, 52, 53, 54, 55, and 56 provided on the lower face 15B of the board 15, and the connecting portions 61, 62, 63, 64, 65, 66, 67, 68, 69, and 70 provided at the side face 15-4 of the board 15 for electrically connecting the first wiring portions 41, 42, 43, 44, and 45 and the second wiring portions 51, 52, 53, 54, 55, and 56, a characteristic of the inverse F type antenna 29 can be promoted by prolonging a wiring length of the inverse F type antenna 29 without making the wiring board 11 larger than necessary.

FIGS. 10A through 10I are views showing steps of fabricating the wiring board according to the first embodiment. In FIGS. 10A through 10I, notation F designates a region formed with the wiring board 11 (hereinafter, referred to as 'wiring board forming region F'), notation G designates a position of cutting a board material 73 (hereinafter, referred to as 'cutting position G'), respectively.

Figure 10E:
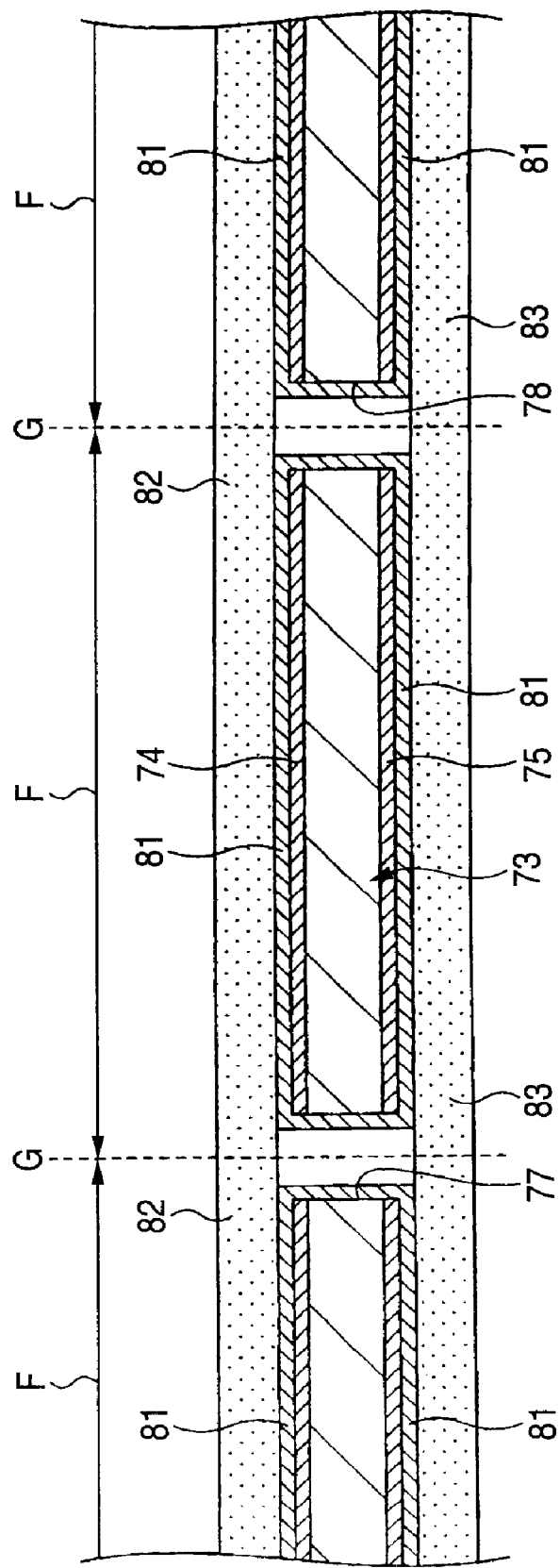
FIG. 10E is a view showing a fabricating step of the wiring board according to the first embodiment of the invention.

Referring now to FIGS. 10A through 10I, in the first step shown in FIG. 10A, the board material 73 having a plurality of the wiring board forming regions F is prepared. The board material 73 is for constituting the board 15 by being cut at step shown in FIG. 10I mentioned later.

Next, in the step shown in FIG. 10B, a metal foil 74 is pasted onto an upper face 73A of the board material 73, and a metal foil 75 is pasted onto a lower face 73B of the board material 73. As the metal foils 74, 75, for example, Cu foils can be used.

Next, in the step shown in FIG. 10C, through holes 77, 78 are formed at the board material 73 in correspondence with the cutting positions G. The through hole 77 becomes the notch portion 15D (refer to FIG. 4) by cutting the board material 73 at the step shown in FIG. 10I mentioned later. A diameter R1 of the through hole 77 can be constituted by, for example, 0.6 mm. Further, the through hole 78 becomes the notch portion 15C (refer to FIG. 4) by cutting the board material 73 at the step shown in FIG. 10I mentioned later.

Next, in the step shown in FIG. 10D, a metal film 81 is formed by a plating method to cover a surface of a structure shown in FIG. 10C (including portions in correspondence with side walls of the through holes 77, 78).

Next, in the step shown in FIG. 10E, a resist film 82 is formed to cover an upper face of the structure shown in FIG. 10D and a resist film 83 is formed to cover a lower face of the structure shown in FIG. 10D.

Figure 10F:
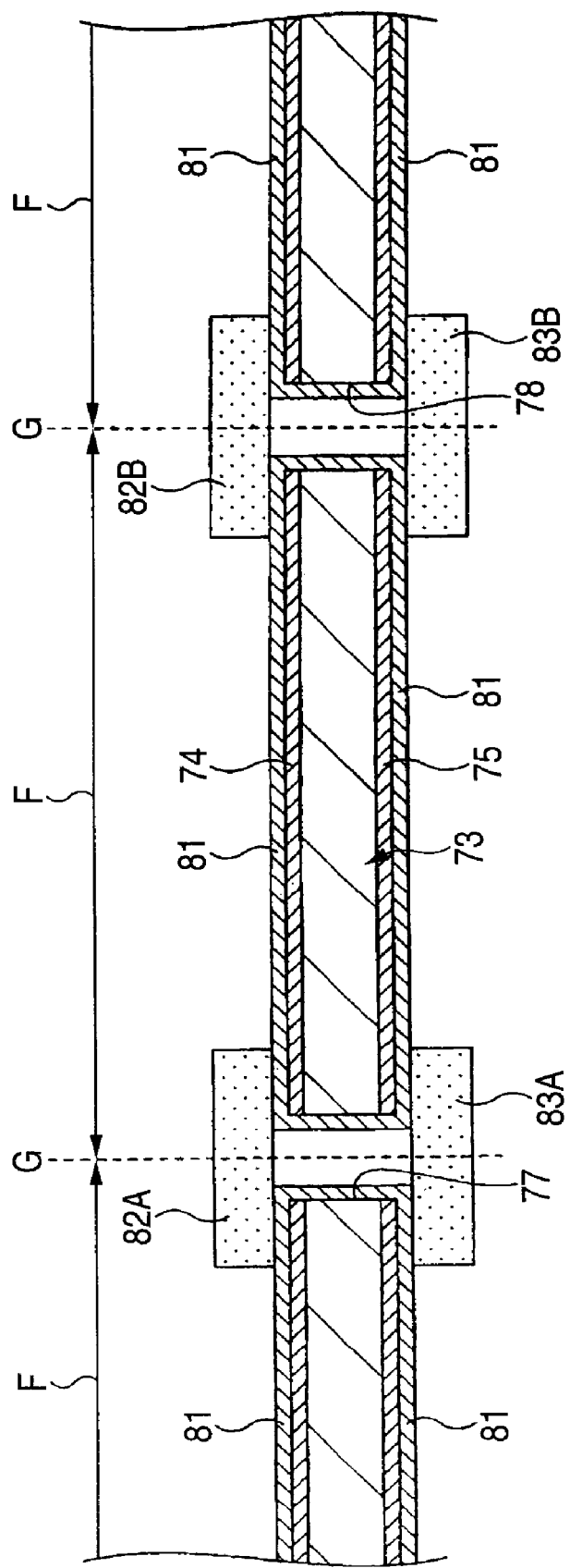
FIG. 10F is a view showing a fabricating step of the wiring board according to the first embodiment of the invention.

Next, in the step shown in FIG. 10F, the resist films 82, 83 shown in FIG. 10E are patterned by an exposure and development process. Specifically, the resist film 82 is patterned to correspond to positions of forming the wirings 24, 25, and 26, the first pad portions 31, 35, and the first wiring portions 41, 42, 43, 44, and 45, and the resist film 83 is patterned to correspond to positions of forming the second pad portions 32, 36 and the second wiring portions 51, 52, 53, 54, 55, and 56. As mentioned above, the first pad portion 31 and the second pad portion 32 are electrically connected with the connecting portion 33 (see FIG. 7). In FIG. 10F, a resist film 82A indicates a resist film in correspondence with the position of forming the first wiring portion 43, a resist film 82B indicates a resist film in correspondence with a position of forming the first pad portion 31, a resist film 83A indicates a resist film in correspondence with a position of forming the second wiring portion 53, and a resist film 83B indicates a resist film in correspondence with the position of forming the second pad portion 32, respectively. As mentioned above, the second wiring portion 53 is electrically connected to the first wiring portion 43 by way of the connecting portion 65.

Further, in FIG. 10F, illustration of resist films in correspondence with positions of forming the wirings 24, 25, and 26, the first pad portion 35, the first wiring portions 41, 42, 44, 45, the second pad portion 36, and the second wiring portions 51, 52, 54, 55, 56 is submitted.

Next in the step shown in FIG. 10G, the metal foils 74, 75 and the metal film 81 are etched by constituting masks by the resist films 82A, 82B, 83A, 83B. Thereby, the inverse F type antenna 29 and the end face electrode 21 are formed. The inverse F type antenna 29 and the end face electrode 21 are respectively formed at the board material 73 disposed on both sides of the cutting position G. Further, by etching the metal foils 74, 75 and the metal film 81, also the wirings 24, 25, and 26, the first pad portion 35, the first wiring portions 41, 42, 44, 45, the second pad portion 36, and the second wiring portions 51, 52, 54, 55, 56, not illustrated, are formed.

Next, in the step shown in FIG. 1H, the resist films 82A, 82B, 83A, 83B are removed. Then, in the step shown in FIG. 10I, by cutting the board material 73 (structure shown in FIG. 10H) along the cutting positions G, a plurality of the wiring boards 11 are fabricated.

Figure 11:
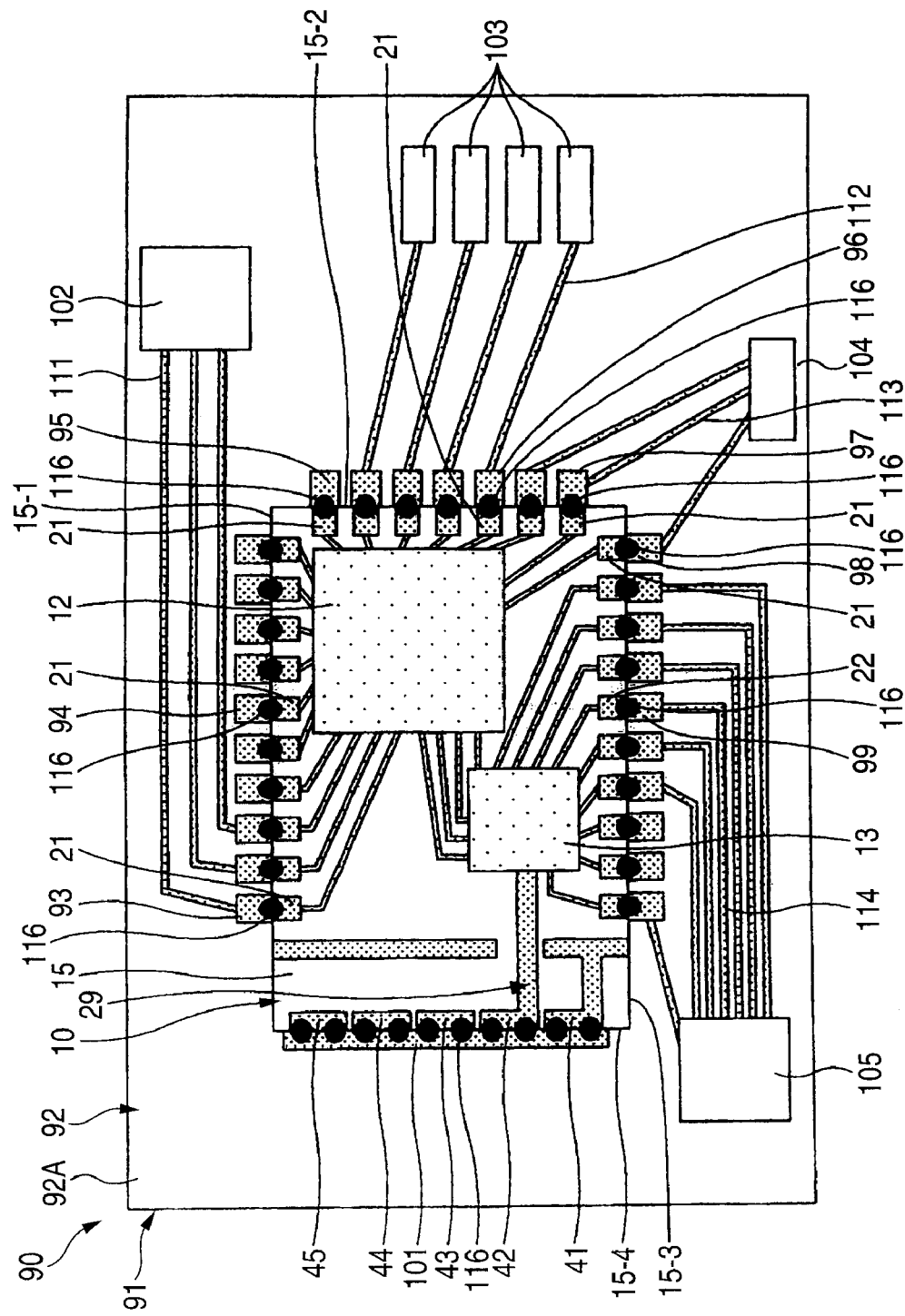
FIG. 11 is a plan view of an electronic apparatus including the semiconductor apparatus according to the first embodiment of the invention.

FIG. 11 is a plan view of an electronic apparatus including a semiconductor apparatus according to the first embodiment of the invention. In FIG. 11, constituent portions, which are the same as those of the semiconductor apparatus 10 of the first embodiment are attached with the same notations. Further, in FIG. 11, illustration of the connecting portions 61, 62, 63, 64, 65, 66, 67, 68, 69, and 70 is omitted.

In reference to FIG. 11, an electronic apparatus 90 includes the semiconductor apparatus 10 according to the first embodiment and a mounting board 91. The semiconductor apparatus 10 is electrically connected to the board main body 92 by a solder 116.

The mounting board 91 includes a board main body 92, pads 93, 94, 95, 96, 97, 98, and 99, an extra pad 101, a USB port connector 102, a plurality of switches 103, a connector 104 for supplying a power source, a microcomputer 105, and wirings 111, 112, 113, and 114.

The pads 93, 94, 95, 96, 97, 98, and 99 and the pad 101 are provided at an upper face 92A of the board main body 92 in correspondence with a region of mounting the semiconductor apparatus 10. The pads 93, 94 are electrically connected to the end face electrodes 21 provided at the side face 15-1 of the board 15 by the solder 116. The pads 95, 96, and 97 are electrically connected to the end face electrodes 21 provided at the side face 15-2 of the board 15 by the solder 116.

The pad 98 is electrically connected to the end face electrode 21 provided at the side face 15-3 of the board 15 by the solder 116. The pad 99 is electrically connected to the end face electrode 22 provided at the side face 15-3 of the board 15.

The extra pad 101 is electrically connected to the connecting portions 61, 62, 63, 64, 65, 66, 67, 68, 69, and 70 (not shown in FIG. 11) provided at the side face 15-4 of the board 15. The extra pad 101 is for fixing the side face 15-4 of the board 15 to the mounting board 91. Thereby, four of the side faces 15-1, 15-2, 15-3, and 15-4 of the board 15 are fixed to the mounting board 92.

By fixing the four side faces 15-1, 15-2, 15-3, and 15-4 of the board 15 to the mounting board 91 in this way, a strength of the connection between the semiconductor apparatus 10 and the mounting board 91 can be increased.

The USB port connector 102 is provided at the upper face 92A of the board main body 92. The USB port connector 102 is electrically connected to the pad 93 by way of the wiring 111.

The plurality of switches 103 are provided at the upper face 92A of the board main body 92. The plurality of switches 103 are electrically connected to the pads 96 by way of the wirings 112. The plurality of switches 103 are for controlling the microcomputer 105.

The connector 104 for supplying a power source is provided at the upper face 92A of the board main body 92. The connector 104 for supplying a power source is electrically connected to the pads 97, 98 by way of the wirings 113.

The microcomputer 105 is provided at the upper face 92A of the board main body 92. The microcomputer 105 is for controlling operation of the semiconductor apparatus 10. The microcomputer 105 is electrically connected to the pad 99 by way of the wiring 114.

The wirings 111, 112, 113, and 114 are provided at the upper face 92A of the board main body 92. One end portion of the wiring 111 is connected to the pad 93 and other end portion thereof is connected to the USB port connector 102. One end portion of the wiring 112 is connected to the pad 96 and other end portion thereof is connected to the switch 103.

One end portion of the wirings 113 is connected to the pads 97, 98, and other end portion thereof is connected to the connector 104 for supplying a power source. One end portion of the wiring 114 is connected to the pad 99 and other end portion thereof is connected to the microcomputer 105.

According to the electronic apparatus of the embodiment, by fixing four of the side faces 15-1, 15-2, 15-3, and 15-4 of the board 15 on the mounting board 91, the strength of connecting the semiconductor apparatus 10 and the mounting board 91 can be promoted.

Second Embodiment

Figure 12:
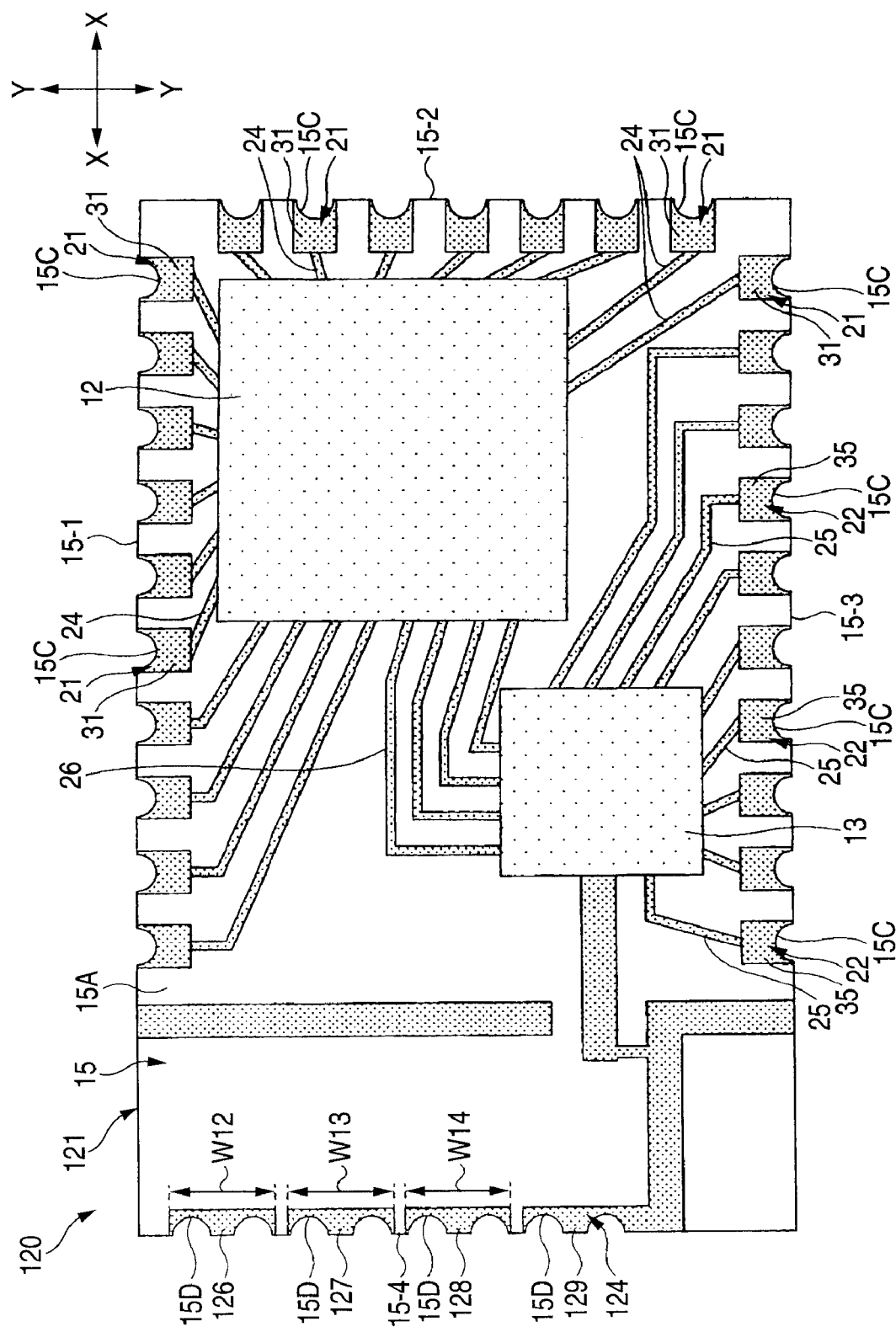
FIG. 12 is a plan view of a semiconductor apparatus according to a second embodiment of the invention.

FIG. 12 is a plan view of a semiconductor apparatus according to a second embodiment of the invention. In FIG. 12, constituent portions, which are the same as those of the semiconductor apparatus 10 according to the first embodiment are attached with the same notations.

In reference to FIG. 12, the semiconductor apparatus 120 according to the second embodiment is constituted similar to the semiconductor apparatus 10 except that a wiring board 121 is provided in place of the wiring board 11.

Figure 13:
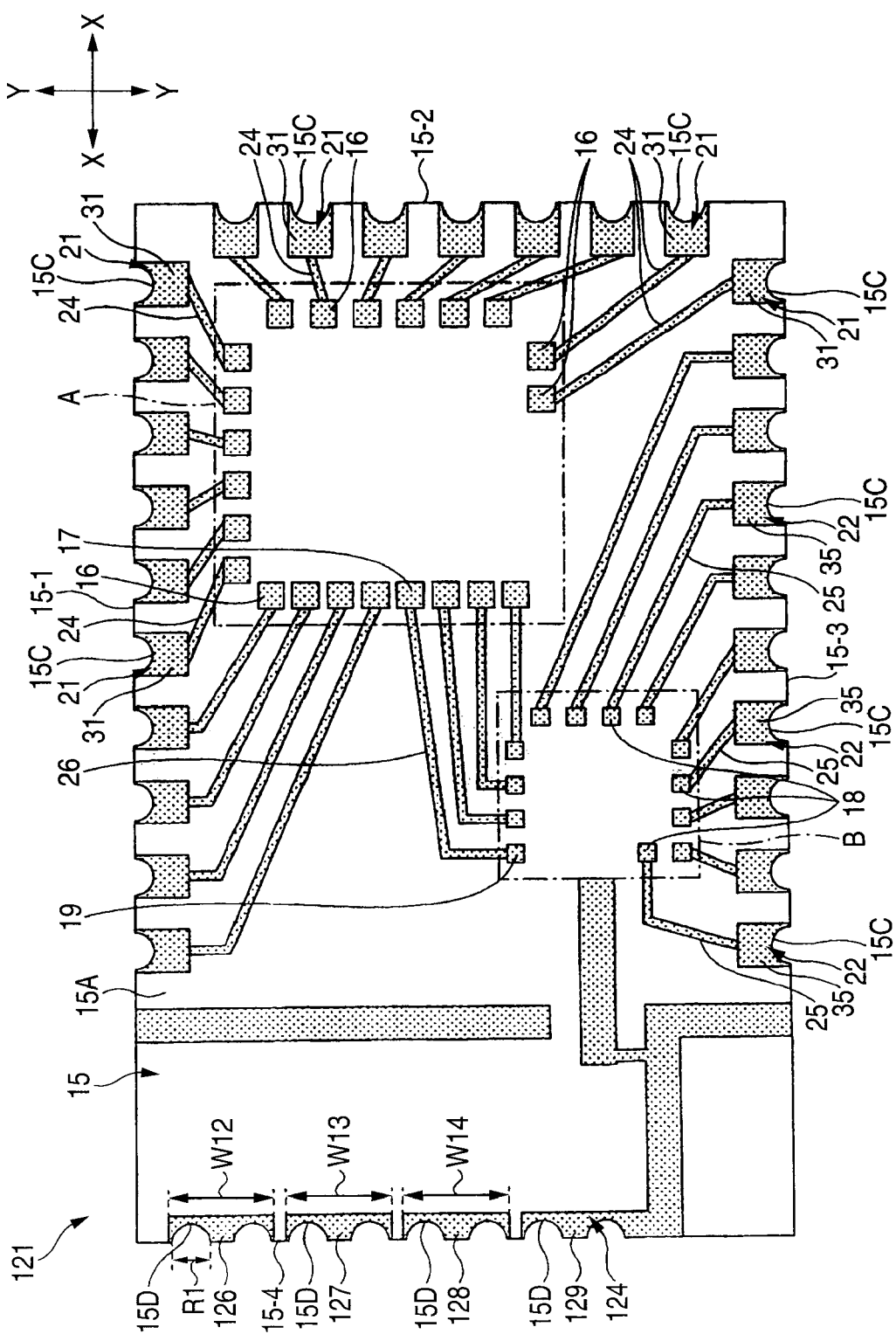
FIG. 13 is a plan view of a wiring board according to the second embodiment of the invention.
Figure 14:
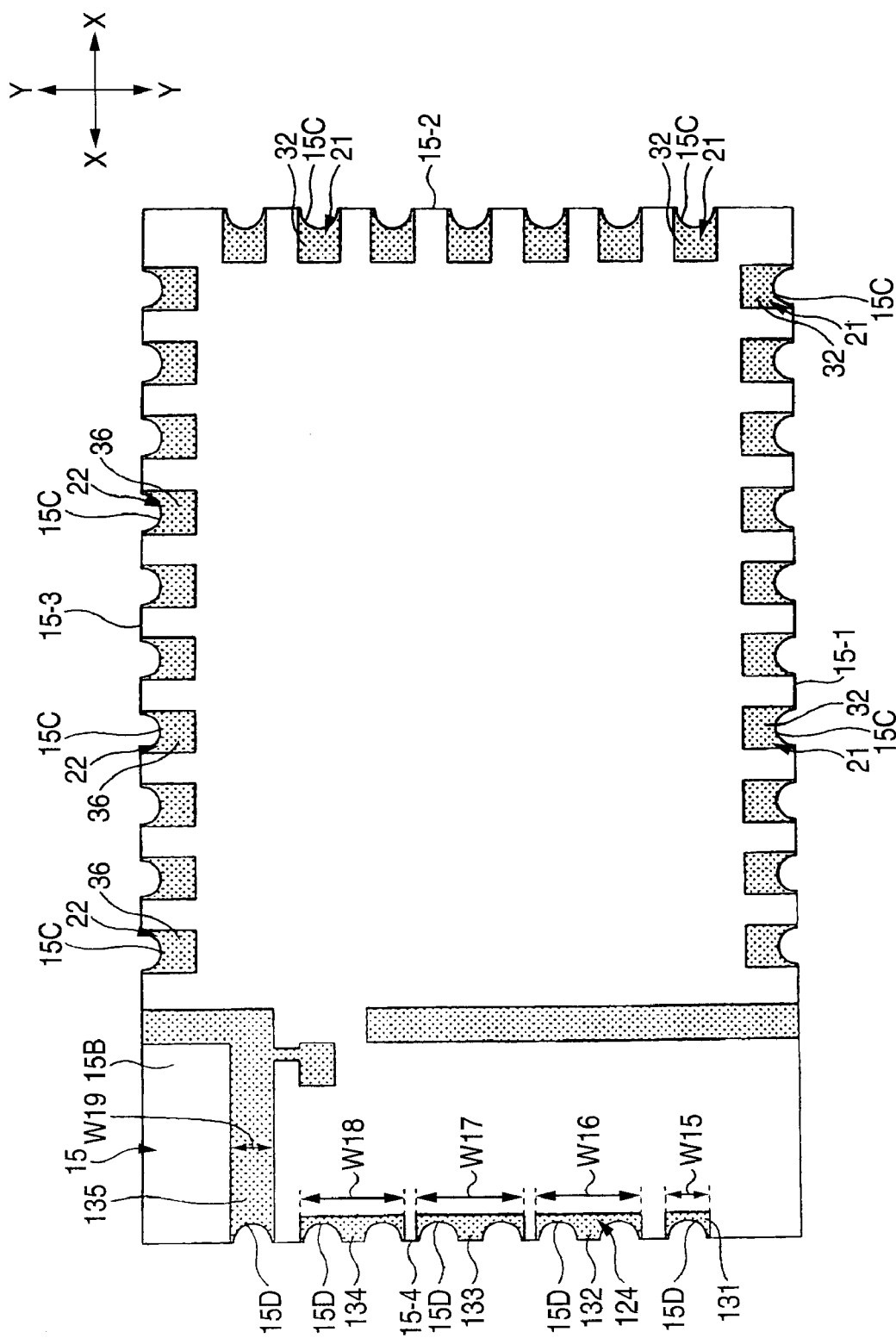
FIG. 14 is a view showing a lower face side of the wiring board shown in FIG. 13 in a plan view.

FIG. 13 is a plan view of the wiring board according to the second embodiment of the invention, FIG. 14 is a view showing a lower face side of the wiring board shown in FIG. 13. Further, FIG. 15 is a view showing the semiconductor apparatus shown in FIG. 12 in a side view thereof.

Figure 15:
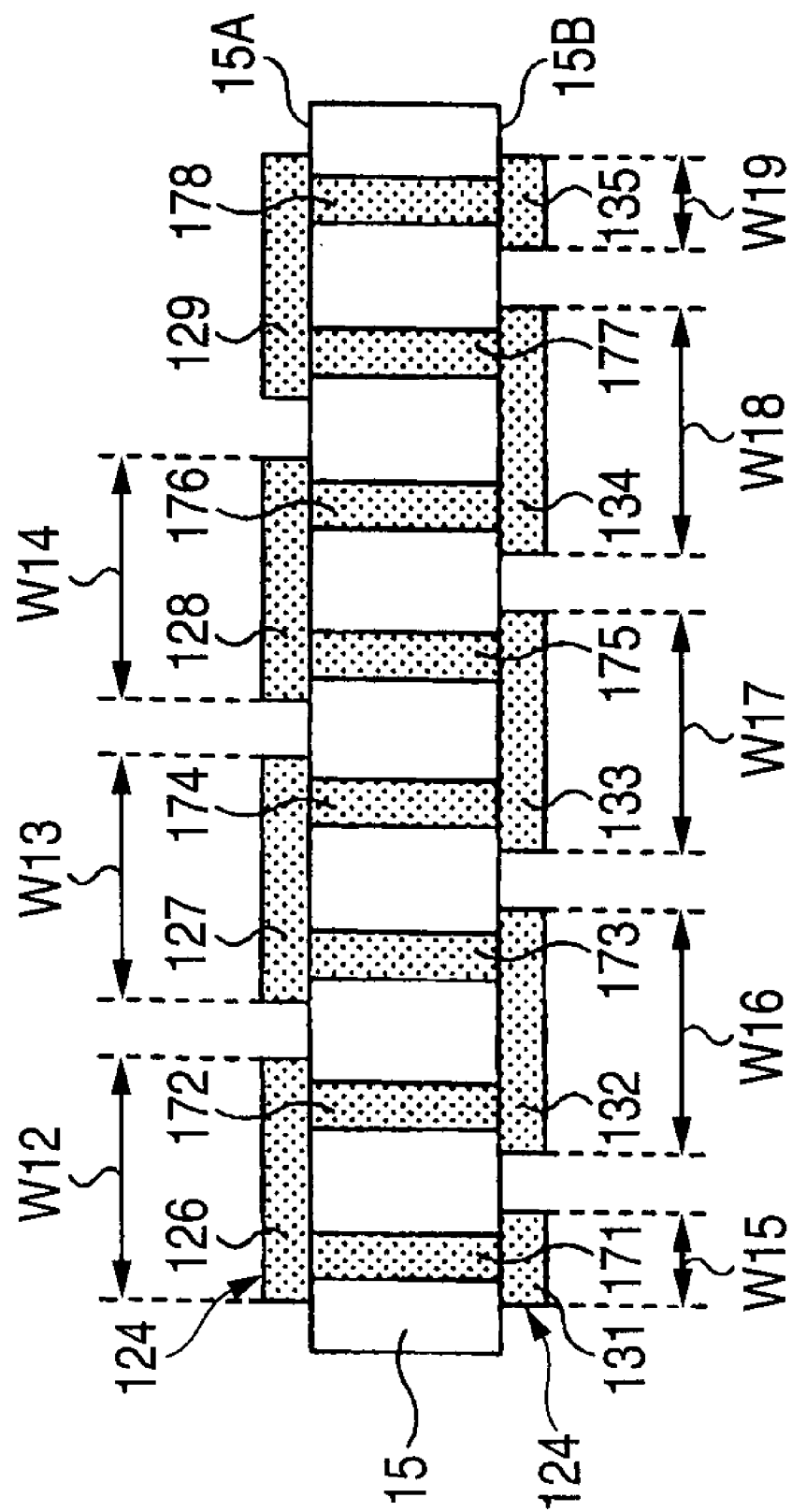
FIG. 15 is a view showing the semiconductor apparatus shown in FIG. 12 in a side view.

In reference to FIGS. 13, 14, and 15, the wiring board 121 (FIG. 13) is constituted similar to the wiring board 11 except that an inverse L type antenna 124 is provided in place of the inverse F type antenna 29 provided at the wiring board 11 explained in the first embodiment.

The inverse L type antenna 124 is electrically connected to a ground layer and a power source layer (both of which are not illustrated) formed at the board 15. The inverse L type antenna 124 includes first wiring portions 126, 127, 128, and 129 (FIGS. 13 and 15), second wiring portions 131, 132, 133, 134, and 135 (FIGS. 14 and 15), and connecting portions 171, 172, 173, 174, 175, 176, 177, and 178 (FIG. 15).

Referring now to FIG. 15, the first wiring portions 126, 127, 128, and 129 are provided at the upper face 15A of the board 15 in correspondence with positions of forming the notch portions 15D (FIG. 13). The first wiring portions 126, 127, 128, and 129 are arranged in the Y-Y direction (FIG. 13). A width W12 (see also FIG. 13) of the first wiring portion 126 is constituted by, for example, 1.6 mm. Widths W13 and W14 (see also FIG. 13) of the first wiring portions 127, 128 can be made to be substantially equal to the width W12 of the first wiring portion 126. The first wiring portion 129 is electrically connected to the RF circuit part 13 (refer to FIG. 12).

The second wiring portions 131, 132, 133, 134, and 135 are provided at the lower face 15B of the board 15 in correspondence with positions of forming the notch portions 15D (FIG. 14). The second wiring portions 131, 132, 133, 134, and 135 are arranged in the Y-Y direction (FIG. 14). The second wiring portion 131 is electrically connected to the first wiring portion 126 by way of the connecting portion 171. A width W15 (see also FIG. 14) of the second wiring portion 131 is constituted by, for example, 0.8 mm.

The second wiring portion 132 is electrically connected to the first wiring portion 126 by way of the connecting portion 172 and electrically connected to the first wiring portion 127 by way of the connecting portion 173. A width W16 (see also FIG. 14) of the second wiring portion 132 can be constituted by, for example, 1.6 mm.

The second wiring portion 133 is electrically connected to the first wiring portion 127 by way of the connecting portion 174 and electrically connected to the first wiring portion 128 by way of the connecting portion 175. A width W17 (see also FIG. 14) of the second wiring portion 133 can be constituted by, for example, 1.6 mm.

The second wiring portion 134 is electrically connected to the first wiring portion 128 by way of the connecting portion 176 and electrically connected to the first wiring portion 129 by way of the connecting portion 177. A width W18 (see also FIG. 14) of the second wiring portion 134 can be constituted by, for example, 1.6 mm.

The second wiring portion 135 is electrically connected to the first wiring portion 129 by way of the connecting portion 178. A width W19 (see also FIG. 14) of the second wiring portion 135 can be constituted by, for example, 0.8 mm.

The connecting portions 171, 172, 173, 174, 175, 176, 177, and 178 are provided at the notch portions 15D. The connecting portions 171, 172, 173, 174, 175, 176, 177, and 178 are for electrically connecting the first wiring portions 126, 127, 128, and 129 provided at the upper face 15A of the board 15 and the second wiring portions 131, 132, 133, 134, and 135 provided at the lower face 15B of the board 15.

The wiring board 121 constituted as described above can be fabricated by a method similar to that of the wiring board 11 of the first embodiment.

According to the embodiment, by providing a portion of the inverse L type antenna 124 (in this case, the connecting portions 171, 172, 173, 174, 175, 176, 177, and 178) at the side face 15-4 of the board 15, an area occupied by the inverse L type antenna 124 at the upper face 15A of the board 15 is reduced, and therefore, the size of the wiring board 121 can be decreased by reducing the size in the direction of the face of the board 15.

Further, the space between the side face 205-4 and the antenna pattern 218 of the board 205 provided at the conventional semiconductor apparatus 200 (refer to FIG. 1 or 2) is dispensed with, and therefore, the size of the wiring board 121 can be decreased by reducing the size in the direction of the face of the board 15.

Further, since the size of the wiring board 121 can be decreased, the size of the semiconductor apparatus 120 including the wiring board 121 can be decreased.

Further, by constituting the inverse L type antenna 124 from the first wiring portions 126, 127, 128, and 129 provided at the upper face 15A of the board 15, the second wiring portions 131, 132, 133, 134, and 135 provided at the lower face 15B of the board 15, the connecting portions 171, 172, 173, 174, 175, 176, 177, and 178 provided at the side face 15-4 of the board 15 for electrically connecting the first wiring portions 126, 127, 128, and 129 and the second wiring portions 131, 132, 133, 134, and 135, the characteristic of the inverse L type antenna 124 can be promoted by prolonging a wiring length of the inverse L type antenna 129 without making the wiring board 121 larger than necessary.

Although a detailed description is given of the preferable embodiments of the invention as described above, the invention is not limited to the specific embodiments but can variously be modified or changed within the range of the gist of the invention described in the scope of claims. For example, the invention is applicable also to a semiconductor apparatus including an antenna other than the inverse F type antenna 29 and the inverse L type antenna 124.

According to the invention, the invention relates to the wiring board and the semiconductor apparatus, and is applicable to the wiring board and the semiconductor apparatus particularly including the antenna pattern electrically connected to the electronic part.

What is claimed is:

1. A wiring board comprising:
   a board arranged with an electronic part; and
   an antenna pattern provided on the board and electrically connected to the electronic part,
   wherein a portion of the antenna pattern is provided at a side face of the board, and wherein the antenna pattern includes:
  a first wiring portion provided at a first main face of the board;
  a second wiring portion provided at a second main face of the board disposed on a side opposed to the first main face of the board; and
  a connecting portion provided at the side face of the board for electrically connecting the first wiring portion and the second wiring portion.

2. The wiring board according to claim 1, wherein the antenna pattern is an inverse F type.

3. The wiring board according to claim 1, wherein the antenna pattern is an inverse L type.

4. A semiconductor apparatus comprising:
an electronic part;
a board arranged with the electronic part; and
an antenna pattern provided on the board and electrically connected to the electronic part,
wherein a portion of the antenna pattern is provided at a side face of the board, and
wherein the antenna pattern includes;
  a first wiring portion provided at a first main face of the board;
  a second wiring portion provided at a second main face of the board disposed on a side opposed to the first main face of the board; and
  a connecting portion provided at the side face of the board for electrically connecting the first wiring portion and the second wiring portion.

5. The semiconductor apparatus according to claim 4, wherein the antenna pattern is an inverse L type.

6. The semiconductor apparatus according to claim 4, wherein the antenna pattern is an inverse F type.

* * * * *